United States Patent [19]
Saitoh

[11] Patent Number: 5,689,514
[45] Date of Patent: Nov. 18, 1997

[54] METHOD AND APPARATUS FOR TESTING THE ADDRESS SYSTEM OF A MEMORY SYSTEM

[75] Inventor: Toshiharu Saitoh, South Burlington, Vt.

[73] Assignee: International Business Machines Corporation, Armonk, N.Y.

[21] Appl. No.: 724,573

[22] Filed: Sep. 30, 1996

[51] Int. Cl.⁶ ............................................. G06F 11/00
[52] U.S. Cl. ................................... 371/21.2; 371/21.1
[58] Field of Search .............................. 371/21.1, 21.2, 371/21.6, 46.1; 365/195, 201, 230

[56] References Cited

U.S. PATENT DOCUMENTS

| | | | |
|---|---|---|---|
| 4,430,712 | 2/1984 | Coulson et al. | 364/300 |
| 4,435,775 | 3/1984 | Brantingham et al. | 364/900 |
| 4,694,433 | 9/1987 | Wiedman | 365/230 |
| 4,775,942 | 10/1988 | Ferreri et al. | 364/491 |
| 4,969,148 | 11/1990 | Nadeau-Dostie et al. | 371/21.1 |
| 5,121,355 | 6/1992 | Gubbels et al. | 365/200 |
| 5,278,956 | 1/1994 | Thomsen et al. | 395/250 |
| 5,341,382 | 8/1994 | Levitt | 371/22.1 |
| 5,434,406 | 7/1995 | Freeman et al. | 364/490 |

*Primary Examiner*—Vincent P. Canney
*Attorney, Agent, or Firm*—Heslin & Rothenberg, P.C.

[57] ABSTRACT

A method and apparatus for testing or verifying proper operation of an address system of a memory system are provided. The address system includes a write unit for driving write word lines, based on a write address, and a read unit for driving read word lines, based on a read address. A common address is applied to the write unit and read unit, and the outputs thereof are compared for equivalency, using a verification circuit. Proper operation of the address system is indicated by the verification circuit if the outputs of the write and read units are equivalent, and improper operation is indicated if the outputs are not equivalent.

48 Claims, 3 Drawing Sheets

METHOD AND APPARATUS FOR TESTING THE ADDRESS SYSTEM OF A MEMORY SYSTEM

RELATED APPLICATION INFORMATION

This application relates to the following commonly assigned, U.S. patent applications:

Application Ser. No. 08/575,312, entitled "Field Programmable Memory Array," filed Dec. 20, 1995;

Application Ser. No. 08/575,422, entitled "System For Implementing Write, Initialization, And Reset In A Memory Array Using A Single Cell Write Port," filed Dec. 20, 1995; and Application Ser. No. 8/724,572, Attorney Docket No. F19-96-091, entitled "Method And Apparatus For Testing The Data Output System Of A Memory System," filed concurrently herewith.

Each of these applications is hereby incorporated by reference herein in its entirety.

TECHNICAL FIELD

This invention relates to digital memory systems. More particularly, this invention relates to a method and apparatus for verifying proper operation of an address system of a digital memory system.

BACKGROUND OF THE INVENTION

Test techniques for memory systems conventionally include the application of predetermined input bit patterns to memory cells of the memory system, and thereafter reading the contents of the memory cells to determine whether the output patterns match the input patterns. If the output patterns do not match the input patterns, it follows that a fault has occurred somewhere in the memory system.

Memory systems, however, are becoming increasingly complex, and the above conventional input/output pattern matching technique does not offer an adequate level of fault isolation for such complex memory systems. An exemplary, complex memory system is disclosed in the above-incorporated U.S. patent application entitled "Field Programmable Memory Array." FIG. 1 herein is a functional block diagram of the subsystems of the field programmable memory array, which are discussed in detail in the incorporated application. Programmable memory array 10 includes a plurality of memory sub-arrays $12_1$, $12_2$, $12_3$, . . . along with respective data input multiplexers $14_1$, $14_2$, $14_3$, . . . and respective data output multiplexers $15_1$, $15_2$, $15_3$, . . . An address system 20 produces signals on write word lines $50_1$ and read word lines $60_1$ for memory sub-array $12_1$. The signals on the write word lines are produced by using multiplexer $22_1$ and decoder $24_1$. Multiplexer $22_1$ programmably selects a write address 30 from an address bus (not shown), and decoder $24_1$ decodes the selected address and applies the proper signals to write word lines $50_1$. Multiplexer $26_1$ and decoder $28_1$ similarly process a read address 40 and apply the proper signals to read word lines $60_1$.

The potential complexity of the memory system of FIG. 1 results from, in addition to customized memory sub-arrays 12, the data handling system including multiplexers 14 and 15, as well as the address handling system 20. The complexity of address system 20 can be better understood by reviewing FIGS. 26a–c of the above-incorporated U.S. patent application entitled "Field Programmable Memory Array."

Using the above-identified conventional input/output pattern matching test techniques for the system of FIG. 1 results in a memory system test signal path of the following form:

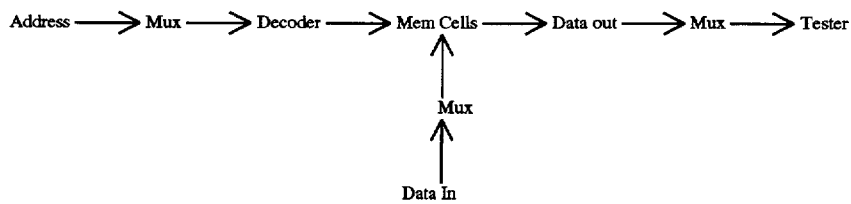

An input/output pattern matching test is adequate to indicate that a fault has occurred somewhere in the above path, however, it is not adequate to isolate a particular system within which the fault has occurred. Complex address and data handling systems are more likely to produce faults, and isolation of such faults is required to effectively test the entire system.

What is required, therefore, are test/verification methods and systems which provide a greater degree of fault isolation for complex memory systems.

SUMMARY OF THE INVENTION

The shortcomings of conventional test techniques are overcome by the present invention which provides a technique to isolate errors in the address system of a memory system.

The memory system includes an array of memory cells operable with a plurality of write word lines and a plurality of read word lines. An address system is coupled to the plurality of write word lines and the plurality of read word lines and includes a write address unit for producing, from a write address, write signals on the plurality of write word lines. Further, the address system includes a read address unit for producing, from a read address, read signals on the plurality of read word lines. A verification circuit is coupled to receive the write signals and the read signals, such that upon application of the write and read addresses to the write address unit and the read address unit, the write signals and the read signals are processed by the verification circuit to verify proper operation of the address system.

The verification circuit may include a compare circuit for comparing the read signals to the write signals. Upon the application of a common address as the write and read addresses to the write and read units, the compare circuit provides a state on at least one output thereof, indicating an equivalency or difference between the read signals and the write signals. An equivalency indicates proper operation of the address system, and a difference indicates improper operation of the address system.

In another embodiment, the verification circuit may include a plurality of compare gates, each of the compare gates having a first input coupled to receive a respective one of the write signals, and a second input coupled to receive a corresponding one of the read signals. Each of the compare gates provides a given output state at an output thereof indicating an equivalency or difference between its respective write signal and read signal. An output gate may be provided having a plurality of inputs coupled to the outputs of the compare gates. The output gate provides the verification circuit output state at an output thereof upon sensing of the given output state at any one of its plurality of inputs, the output gate thereby providing an indication of a difference between the read signals and the write signals (if the given output state indicates a difference).

The compare gates may be implemented as exclusive OR gates, and the output gate may be implemented as an OR gate.

The write address unit or the read address unit, or both, may include an address decoder to produce the respective write or read signals from the respective write or read address. Further, the write address unit or the read address unit, or both, may include at least one programmable multiplexer to programmably select the respective write address or read address from an address bus and apply the respective write or read address to the respective address decoder. In this respect, the invention may be implemented in a field programmable memory array.

In another aspect, the invention is a method for verifying proper operation of an address system of a memory array. First word line outputs of a first unit of the address system are compared to the second word line outputs of a second unit of the address system upon application of a common address to both the first unit and the second unit. The comparing may include, for respective pairs of outputs each comprising a first word line output and a corresponding second word line output, determining an equivalency or difference between the outputs of the pair of outputs. Improper operation of the address system is indicated if there is a difference between the outputs of any pair of outputs, and proper operation of the address system is indicated if there are no differences between the outputs of all pairs of outputs.

An enhanced embodiment of the invention is disclosed wherein stuck-at faults of individual word lines can be detected and isolated.

The verification apparatus and methods of the instant invention therefore provide an effective fault-isolation technique for an address system of a memory system. The instant invention is an improvement over conventional input/output pattern matching techniques, because the instant invention allows for isolation of a fault within the address system, to the exclusion of any faults which may reside in other portions of the memory system.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

DETAILED DESCRIPTION OF THE PREFERRED EMBODIMENT(S)

As discussed above with reference to FIG. 1, a complex memory system 10 may include a complex address system 20. The address system for memory sub-array $12_1$ may include a write address unit having a multiplexer $22_1$ and a decoder $24_1$ to generate signals on write word lines $50_1$. A similar read address unit having multiplexer $26_1$ and decoder $28_1$ is provided to produce read signals on read word lines $60_1$. Multiplexers $22_1$ and $26_1$ receive write address 30 and read address 40, respectively, from an address bus (not shown). These multiplexers may be programmable using configuration memory (not shown), in accordance with the above-incorporated U.S. patent application entitled "Field Programmable Memory Array." The instant invention relates to a method and apparatus for verifying the proper operation of address system 20.

Figure 2:
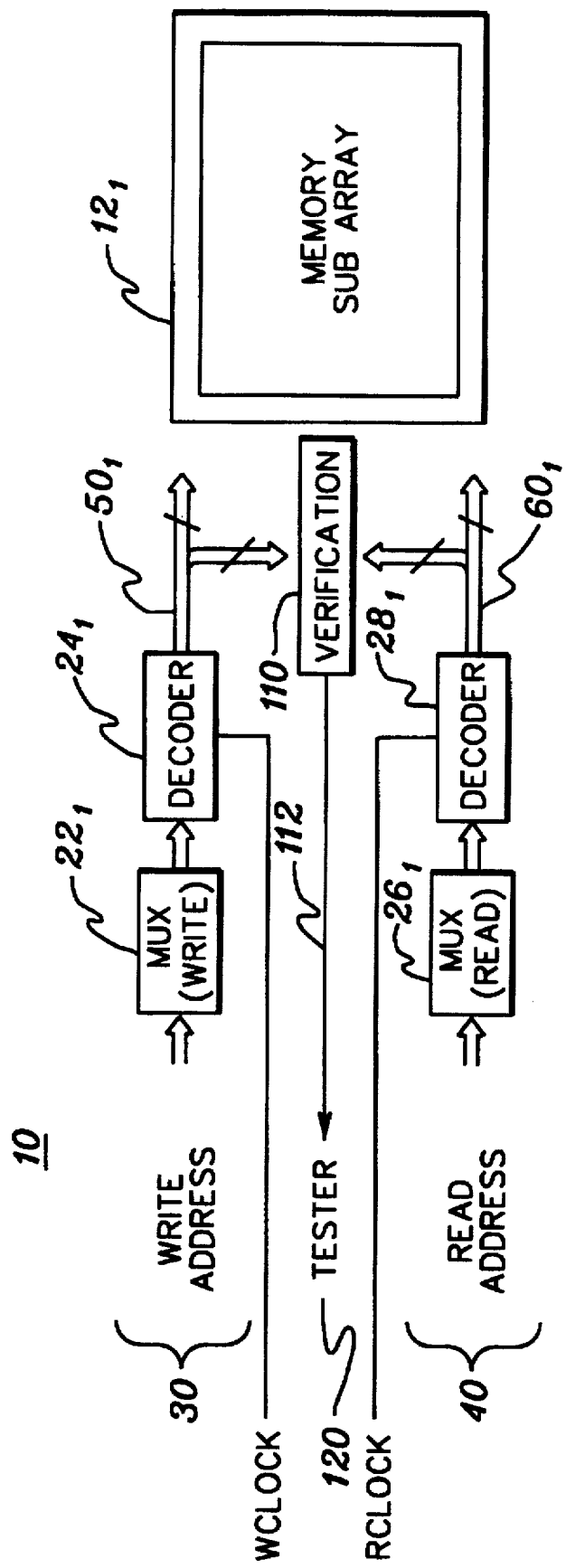
FIG. 2 is a functional block diagram depicting a verification circuit coupled to receive write and read signals from write and read word lines driven by the address system, in accordance with the principles of the present invention.

With reference to FIG. 2, a verification circuit 110 is provided to verify the proper operation of the address system, in accordance with the principles of the present invention. (Like reference numerals are used to designate like elements in the figures herein.)

Signals from write word lines $50_1$ and read word lines $60_1$ are both applied to verification circuit 110. In accordance with the present invention, a common address is applied to multiplexers $22_1$ and $26_1$ from an address bus (not shown). (Programmable multiplexers, if provided, would be similarly programmed to retrieve from the address bus this common address.) If a common address is applied to both the write and read address units, equivalent signals should be produced thereby. If these units are indeed operating fault-free, the signals on the write word lines $50_1$ and read word lines $60_1$ should be equivalent, based upon the application of the common address. Verification circuit 110 is used to compare the signals on write word lines $50_1$ and read word lines $60_1$ and an output of this compare 112 is applied to an internal or external tester 120, employed by the user for testing the memory system.

By employing verification circuit 110, in the configuration depicted in FIG. 2, the test signal path is now:

Address→Mux→Decoder→Tester

Upon comparison of this test path to the much more complicated test path illustrated above for a conventional input/output pattern matching test, it is evident that a fault can now be isolated within the address system itself without regard to the operation of the memory sub-array or its data input or output systems. Such fault isolation is especially necessary when considering the rather complex address systems being employed in memory systems, such as a field programmable memory array.

The verification technique of the instant invention can isolate faults to the address system which may include the multiplexers and/or decoders and individual word lines depicted in FIG. 2, as well as the configuration memory (not shown) which may be associated with multiplexers $22_1$ and $26_1$, and the address bus itself (not shown) upon which the common address is carried.

Figure 3:
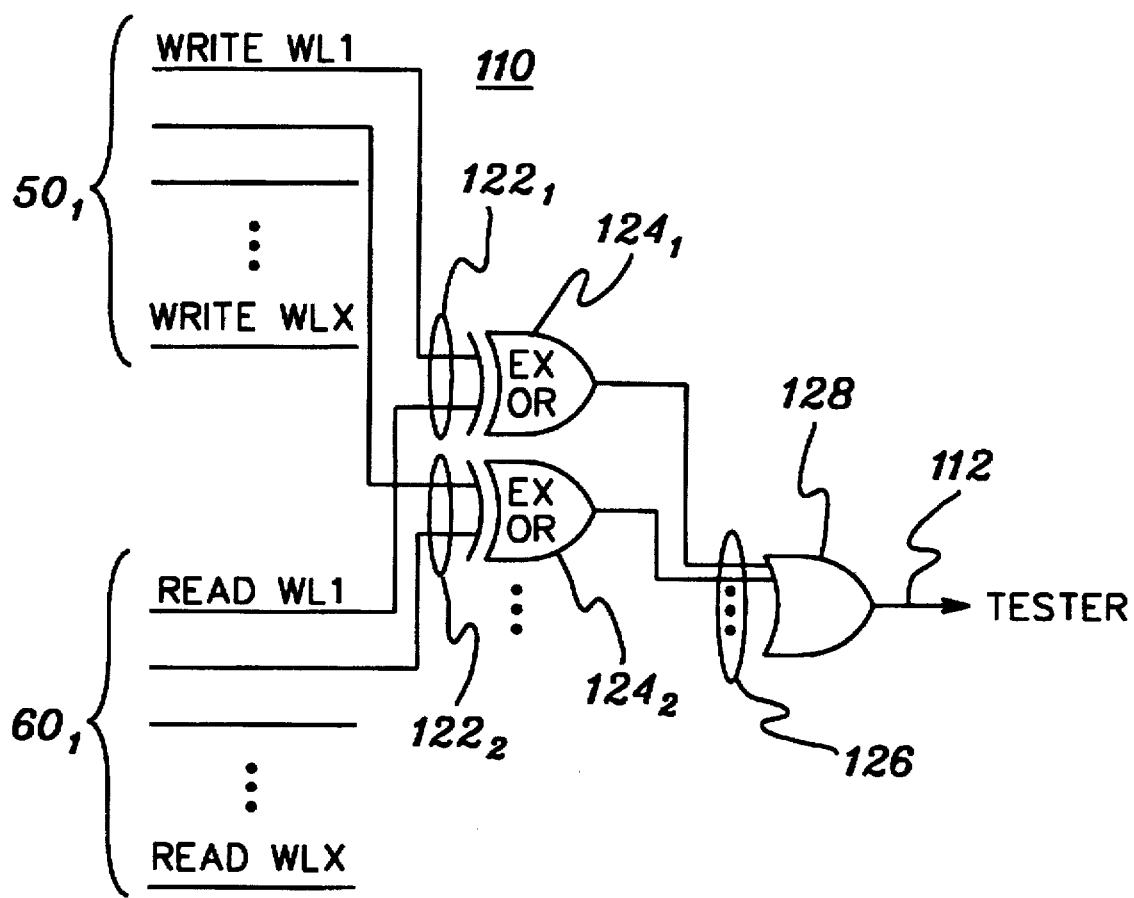
FIG. 3 is a logic diagram of an exemplary verification circuit containing compare logic, in accordance with the principles of the present invention.

An exemplary embodiment of verification circuit 110 is depicted in FIG. 3, in logic diagram form. Write word lines $50_1$, including WRITE WL1–WL9, are each associated with a respective row of memory cells in a memory sub-array.

Similarly, read word lines $60_1$, including READ WL1–WL9, are also respectively associated with the rows of memory cells. Therefore, each row of memory cells may have a write word line and a read word line associated therewith. As discussed above, if a common address is applied to both the write and read units within the address system, the signals carried on write word lines $50_1$ and read word lines $60_1$ should be equivalent if the address system is operating fault-free. This equivalency is tested using XOR gates $124_1$, $124_2$ . . . to which are applied respective pairs, $122_1$ and $122_2$, of write and read signals on write and read word lines. As known to those skilled in the art, any difference in the input levels to an XOR gate will trigger the XOR gate. The outputs 126 of the XOR gates 124 are collectively applied to OR gate 128, which produces the verification circuit output 112. An active level or state on any input 126 to OR gate 128 will trigger OR gate 128, thus providing an active level or state on output 112. An active level or state on output 112 is therefore indicative of any difference between the signals on write word lines $50_1$ and read word lines $60_1$.

In an enhanced embodiment of the present invention, "stuck-at" faults of individual word lines can be detected and isolated using the verification circuit discussed above in connection with clock lines which can be used to inactivate the write and/or read word lines as a group.

Figure 1:
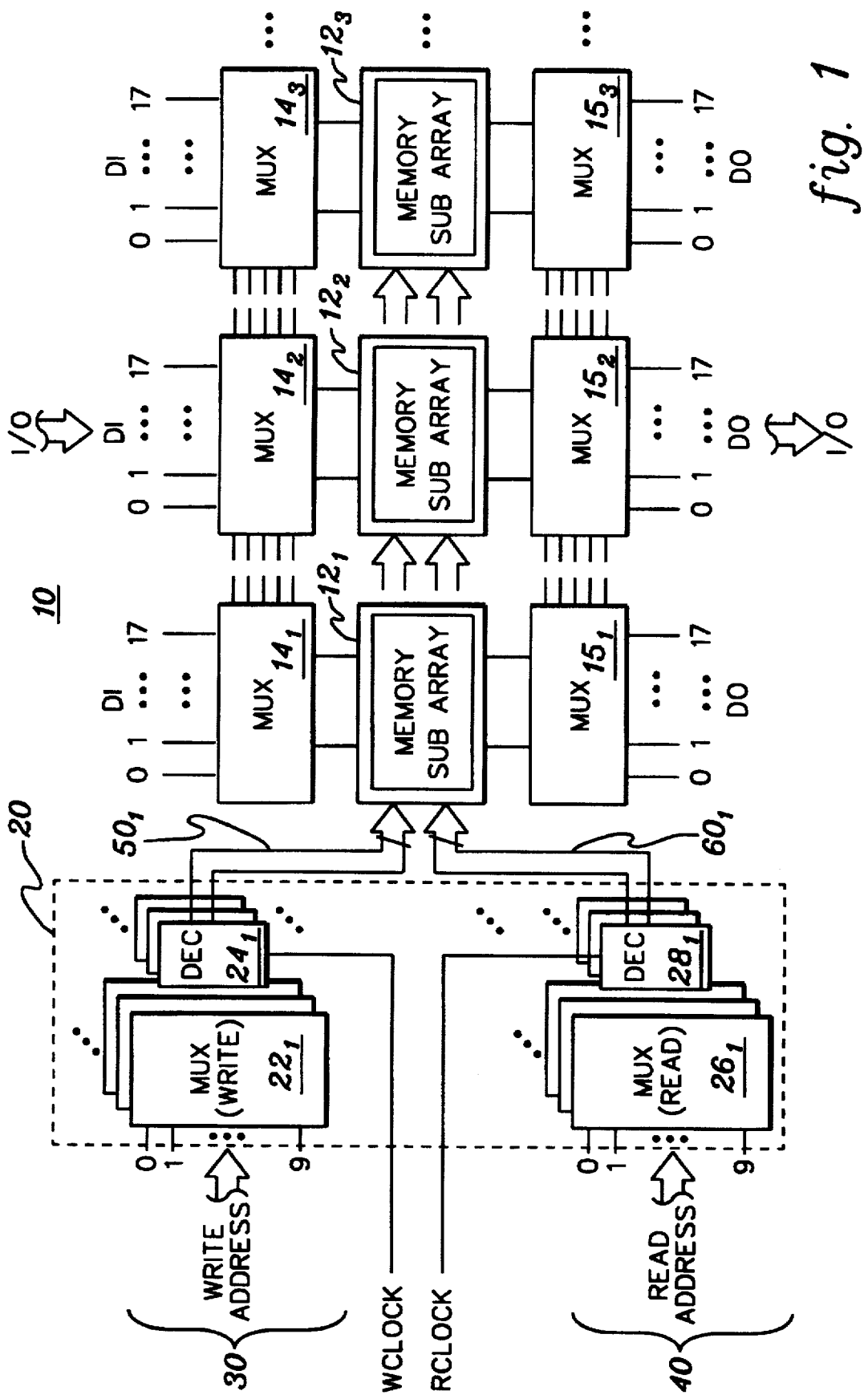
FIG. 1 is a functional block diagram of a memory system illustrating the relationship between an address system and sub-arrays of memory cells.

As discussed in the above-incorporated U.S. patent application entitled "Field Programmable Memory Array," and as depicted herein in FIG. 1 and FIG. 2, exemplary lines designated herein as WCLOCK and RCLOCK are employed to activate/inactivate decoders 24 and 28 within address system 20. By using these clock lines to inactivate (e.g., set to known logic 0) all of the respective output write or read word lines, stuck-at faults of individual word lines can be detected.

Stuck-At-0:

For example, to detect a stuck-at fault of 0 on a write word line, RCLOCK is used to set all read word lines produced by a decoder 28 to a known logic 0. Known write addresses are then sequentially applied to a decoder 24 such that a logic 1 is sequentially propagated across the respective write word lines. The verification circuit 110 will detect a difference, and therefore indicate an apparent error, every time this logic 1 appears together with the logic 0 from the corresponding read word line. These errors detected are intentional, as RCLOCK is being used to inactivate all read word lines. However, if the verification circuit indicates no error, or an equivalency, while the logic 1 is applied to one of the write word lines, the write word line is likely experiencing a stuck-at-0 fault, as full equivalency is being indicated by the verification circuit, despite the application of an apparent logic 1 to one of the write word lines. This stuck-at-0 fault on the write word line has therefore been detected.

Multiple stuck-at-0 faults can be detected by simply noting each "equivalency" output of the verification circuit while the logic 1 is being propagated.

The same technique can be similarly used to detect stuck-at-0 faults on the read word lines by using WCLOCK to inactivate the write word lines.

Stuck-at-1:

To detect a stuck-at fault of 1 on a write word line, WCLOCK is used to set all write word lines produced by a decoder 24 to an apparently known logic 0. Known read addresses are then sequentially applied to a decoder 28 such that a logic 1 is sequentially propagated across the respective read word lines. The verification circuit 110 will detect a difference while the logic 1 is being propagated, unless a stuck-at-1 fault is present on one of the write word lines, in which case the verification circuit will detect an equivalency. This stuck-at-1 fault on the write word line has therefore been detected. (Multiple stuck-at-1 faults may be more difficult to detect since a difference will always be sensed by the verification circuit if only a single "1." is being propagated across the read word lines.)

The same technique can be used to detect stuck-at-1 faults on the read word lines by using RCLOCK to apparently inactivate the read word lines.

Those skilled in the art will recognize that the signal polarities and types of gates employed in the verification circuit may be varied without departing from the principles of the present invention. The term "gate" is used broadly herein to denote any type of electrical circuit. The terms "coupling" and "connecting" are used broadly herein to denote direct connections between elements, or indirect connections (e.g., buffered/inverted) over which the associated information is nevertheless communicated between elements.

Further, the verification circuit disclosed herein can be employed to verify the operation of any two address units of an address system, for which equivalent outputs are expected from a common address input.

This invention may also be used in combination with the data output system techniques disclosed in the above-incorporated U.S. patent application entitled "Method and Apparatus for Testing the Data Output System of a Memory System" to provide fault isolation to the address and/or data output systems.

The instant invention offers a greater degree of fault isolation in memory systems than conventional input/output pattern matching tests can provide. This greater degree of fault isolation is especially important for complex memory systems, in which the complexity of the individual systems therein increases the likelihood of untraceable errors when using a conventional input/output pattern matching technique.

While the invention has been particularly shown and described with reference to preferred embodiment(s) thereof, it will be understood by those skilled in the art that various changes in form and details may be made therein without departing from the spirit and scope of the invention.

What is claimed is:

1. A memory system, comprising:
    an array of memory cells operable with a plurality of write word lines and a plurality of read word lines;
    an address system coupled to the plurality of write word lines and the plurality of read word lines, the address system including:
        a write address unit for producing, from a write address, write signals on the plurality of write word lines, and
        a read address unit for producing, from a read address, read signals on the plurality of read word lines; and
    a verification circuit coupled to receive the write signals and the read signals, such that upon application of the write and read addresses to the write address unit and the read address unit of the address system respectively, the write signals and the read signals produced thereby are processed by the verification circuit to verify proper operation of the address system.

2. The memory system of claim 1, wherein the verification circuit comprises:
    a compare circuit for comparing the read signals to the write signals.

3. The memory system of claim 2, wherein the compare circuit of the verification circuit includes at least one output and wherein, upon the application of a common address as the write and read addresses to the write and read address units:

the compare circuit provides a state on the at least one output indicating an equivalency or difference between the read signals and the write signals compared thereby, an equivalency indicating proper operation of the address system, a difference indicating improper operation of the address system.

4. The memory system of claim 1, wherein the verification circuit comprises:

at least one compare gate having a first input coupled to receive one of said write signals and a second input coupled to receive a corresponding one of said read signals, the at least one compare gate providing a given output state at an output thereof indicating an equivalency or difference between said one of said write signals and said corresponding one of said read signals.

5. The memory system of claim 4, wherein the at least one compare gate comprises a plurality of compare gates, each of the plurality of compare gates having a first input coupled to receive a respective one of said write signals and a second input coupled to receive a corresponding one of said read signals, each of the plurality of compare gates providing a respective given output state at an output thereof indicating an equivalency or difference between its respective one of said write signals and its corresponding one of said read signals.

6. The memory system of claim 5, wherein the given output state indicates a difference, and wherein the verification circuit further comprises:

an output gate having a plurality of inputs coupled to the outputs of the plurality of compare gates, the output gate providing a verification circuit output state at an output thereof upon sensing of the given output state at any one of its plurality of inputs, the output gate thereby providing an indication of a difference between the read signals and the write signals.

7. The memory system of claim 6, wherein each of the plurality of write word lines carries a respective one of the write signals and each of the plurality of read word lines carries a respective one of the read signals, and wherein the first inputs of the plurality of compare gates are coupled to respective ones of the plurality of write word lines and the second inputs of the plurality of compare gates are coupled to respective ones of the plurality of read word lines.

8. The memory system of claim 7, wherein each of the plurality of compare gates is an exclusive OR gate.

9. The memory system claim 8, wherein the output gate is an OR gate.

10. The memory system of claim 6, wherein each of the plurality of compare gates is an exclusive OR gate.

11. The memory system of claim 10, wherein the output gate is an OR gate.

12. The memory system of claim 6, wherein the output gate is an OR gate.

13. The memory system of claim 5, wherein each of the plurality of compare gates is an exclusive OR gate.

14. The memory system of claim 4, wherein the at least one compare gate is an exclusive OR gate.

15. The memory system of claim 1, wherein at least one of the write address unit and the read address unit of the address system includes an address decoder to produce the respective write or read signals from the respective write or read address.

16. The memory system of claim 15, wherein the at least one of the write address unit and the read address unit of the address system includes at least one programmable multiplexer to select the respective write or read address from an address bus and apply said respective write or read address to the address decoder.

17. A field programmable memory array including the memory system of claim 16.

18. A field programmable memory array including the memory system of claim 1.

19. A method for verifying proper operation of an address system of a memory array having a plurality of memory cells arranged therein, the plurality of memory cells operated using a plurality of write word lines and a plurality of read word lines, the address system producing write signals on the plurality of write word lines from a write address and producing read signals on the plurality of read word lines from a read address, the method comprising:

applying a common test address, as the read address and the write address, to the address system; and comparing the write signals produced by the address system from the common test address to the read signals produced by the address system from the common test address to verify proper operation of the address system.

20. The method of claim 19, wherein said comparing includes:

comparing for equivalency the write signals and the read signals;

and wherein the method further includes:

generating a given state indicating an equivalency or difference between the write signals and the read signals, an equivalency indicating proper operation of the address system, a difference indicating improper operation of the address system.

21. The method of claim 19, wherein individual groups of memory cells of the plurality of memory cells are operated using a respective pair of signals comprising a read signal and a write signal, and wherein the step of comparing includes, for each pair of signals:

determining an equivalency or difference between the signals of the respective pair of signals; and providing an intermediate output indicating said equivalency or difference.

22. The method of claim 21, wherein said intermediate output indicates a difference, the method further comprising:

indicating improper operation of the address system if any of the intermediate outputs indicates a difference.

23. The method of claim 22, further comprising:

indicating proper operation of the address system if none of the intermediate outputs indicates a difference.

24. The method of claim 23, wherein said determining an equivalency or difference between the signals of the respective pair of signals includes:

exclusive ORing the signals of the respective pair of signals.

25. The method of claim 24, wherein said indicating improper operation and said indicating proper operation are included in the step of:

ORing the intermediate outputs.

26. A method for verifying proper operation of an address system of a memory array, comprising:

comparing first word line outputs of a first unit of said address system to second word line outputs of a second unit of said address system upon application of a common address to both the first unit and the second unit.

27. The method of claim 26, wherein the step of comparing includes, for respective pairs of word line outputs each comprising a first word line output and a corresponding second word line output:

determining an equivalency or difference between the outputs of said pair of outputs.

28. The method of claim 27, wherein said step of determining includes:

exclusive ORing the outputs of said pair of outputs.

29. The method of claim 27, further comprising:

indicating improper operation of the address system if there is a difference between the outputs of any pair of outputs.

30. The method of claim 27, further comprising:

indicating proper operation of the address system if there are no differences between the outputs of all respective pairs of outputs.

31. A system for verifying proper operation of an address system of a memory array having a plurality of memory cells arranged therein, the plurality of memory cells operated using a plurality of write word lines and a plurality of read word lines, the address system producing write signals on the plurality of write word lines from a write address and producing read signals on the plurality of read word lines from a read address, the system comprising:

means for applying a common test address, as the read address and the write address, to the address system; and means for comparing the write signals produced by the address system from the common test address to the read signals produced by the address system from the common test address to verify proper operation of the address system.

32. The system of claim 31, wherein said means for comparing includes:

means for comparing for equivalency the write signals and the read signals;

and wherein the system further includes:

means for generating a given state indicating an equivalency or difference between the write signals and the read signals, an equivalency indicating proper operation of the address system, a difference indicating improper operation of the address system.

33. The system of claim 31, wherein individual groups of memory cells of the plurality of memory cells are operated using a respective pair of signals comprising a read signal and a write signal, and wherein the means for comparing includes, for each pair of signals:

means for determining an equivalency or difference between the signals of the respective pair of signals; and means for providing an intermediate output indicating said equivalency or difference.

34. The system of claim 33, wherein said intermediate output indicates a difference, the system further comprising:

means for indicating improper operation of the address system if any of the intermediate outputs indicates a difference.

35. The system of claim 34, further comprising:

means for indicating proper operation of the address system if none of the intermediate outputs indicates a difference.

36. The system of claim 35, wherein said means for determining an equivalency or difference between the signals of the respective pair of signals includes:

means for exclusive ORing the signals of the respective pair of signals.

37. The system of claim 36, wherein said means for indicating improper operation and said means for indicating proper operation are included in a:

means for ORing the intermediate outputs.

38. A system for verifying proper operation of an address system of a memory array, comprising:

means for comparing first word line outputs of a first unit of said address system to second word line outputs of a second unit of said address system upon application of a common address to both the first unit and the second unit.

39. The system of claim 38, wherein the means for comparing includes, for respective pairs of word line outputs each comprising a first word line output and a corresponding second word line output:

means for determining an equivalency or difference between the outputs of said pair of outputs.

40. The system of claim 39, wherein said means for determining includes:

means for exclusive ORing the outputs of said pair of outputs.

41. The system of claim 39, further comprising:

means for indicating improper operation of the address system if there is a difference between the outputs of any pair of outputs.

42. The system of claim 39, further comprising:

means for indicating proper operation of the address system if there are no differences between the outputs of all respective pairs of outputs.

43. A memory system, comprising:

an array of memory cells operable with a plurality of first word lines and a plurality of second word lines;

an address system coupled to the plurality of first word lines and the plurality of second word lines, the address system including:

a first address unit for producing, from a first address, first signals on the plurality of first word lines, and a second address unit for producing, from a second address, second signals on the plurality of second word lines; and a verification circuit coupled to receive the first signals and the second signals, such that upon application of the first and second addresses to the first address unit and the second address unit of the address system respectively, the first signals and the second signals produced thereby are processed by the verification circuit to verify operation of the address system.

44. The memory system of claim 43, wherein the verification circuit comprises:

a compare circuit for comparing the first signals to the second signals.

45. The memory system of claim 43, wherein the second address unit includes:

means for setting the second signals on the plurality of second word lines to a known state, wherein the application of an apparent different known state to a given one of the plurality of first word lines causes a difference to be indicated by the compare circuit, the difference indicating that the given one of the plurality of first word lines attained the different known state and therefore that the given one of the plurality of first word lines is properly operating.

46. The memory system of claim 45, wherein an equivalency is caused to be indicated by the compare circuit upon the application of the apparent different known state to the given one of the plurality of first word lines, the equivalency indicating that the given one of the plurality of first word lines did not attain the different known state and therefore that the given one of the plurality of first word lines is not properly operating.

47. The memory system of claim 43, wherein the first address unit includes:

means for setting the first signals on the plurality of first word lines to an apparent known state, and wherein the application of a different known state to a given one of the plurality of second word lines causes a difference to be indicated by the compare circuit, the difference indicating that one of the plurality of first word lines corresponding to the given one of the plurality of second word lines attained the known state and therefore that the corresponding one of the plurality of first word lines is properly operating.

48. The memory system of claim 47, wherein an equivalency is caused to be indicated by the compare circuit upon the application of the different known state to the given one of the plurality of second word lines, the equivalency indicating that the corresponding one of the plurality of first word lines did not attain the known state and therefore that the corresponding one of the plurality of first word lines is not properly operating.

* * * * *